United States Patent [19]

Tanaka et al.

[11] Patent Number: 4,987,677

[45] Date of Patent: Jan. 29, 1991

[54] BONDED CERAMIC METAL COMPOSITE SUBSTRATE, CIRCUIT BOARD CONSTRUCTED THEREWITH AND METHODS FOR PRODUCTION THEREOF

[75] Inventors: Tadashi Tanaka, Chiba; Kazuo Matsumura, Kanagawa; Hiroshi Komorita, Kanagawa; Nobuyuki Mizunoya, Kanagawa, all of Japan

[73] Assignee: Kabushiki Kaisha Toshiba, Kawasaki, Japan

[21] Appl. No.: 484,875

[22] Filed: Feb. 26, 1990

Related U.S. Application Data

[62] Division of Ser. No. 342,843, Apr. 25, 1989.

[30] Foreign Application Priority Data

Apr. 25, 1988 [JP] Japan .............................. 63-101681

[51] Int. Cl.[5] .......................... H05K 3/02; H05K 3/10

[52] U.S. Cl. ...................................... 29/846; 228/123; 228/124; 228/195; 29/832

[58] Field of Search ................. 29/840, 832, 846, 847; 228/123, 124, 195; 428/612, 687; 174/257-260

[56] References Cited

U.S. PATENT DOCUMENTS

| | | | |
|---|---|---|---|
| 3,716,759 | 2/1973 | Scale et al. | 317/100 |
| 4,409,278 | 10/1983 | Jochym | 428/163 |
| 4,472,762 | 9/1984 | Spinelli et al. | 361/386 |
| 4,490,457 | 12/1984 | Karadashian et al. | 430/311 |
| 4,542,438 | 9/1985 | Yamamoto | 361/403 |
| 4,628,598 | 12/1986 | Taylor | 29/846 |
| 4,767,049 | 8/1988 | Butt et al. | 228/111 |
| 4,811,893 | 3/1989 | Kanahara et al. | 228/198 |
| 4,814,944 | 3/1989 | Sagawa et al. | 361/403 |

FOREIGN PATENT DOCUMENTS 2099742 12/1982 United Kingdom .

*Primary Examiner*—P. W. Echols
*Attorney, Agent, or Firm*—Foley & Lardner, Schwartz, Jeffery, Schwaab, Mack, Blumenthal & Evans

[57] ABSTRACT

A bonded ceramic-metal composite substrate comprising a ceramic substrate having opposite surfaces and a copper sheet having a face directly bonded to one of the surfaces of the ceramic substrate, wherein the median surface roughness ($R_a$) of the outer surface of the copper sheet is not greater than 3 $\mu$m, and the maximum surface roughness ($R_{max}$) of the outer surface of the copper sheet is not greater than 18 $\mu$m. The invention improves the manufacturing reliability of various electronic devices such as semiconductor modules.

12 Claims, 1 Drawing Sheet

BONDED CERAMIC METAL COMPOSITE SUBSTRATE, CIRCUIT BOARD CONSTRUCTED THEREWITH AND METHODS FOR PRODUCTION THEREOF

This application is a division, of application Ser. No. 07/342,843, filed Apr. 25, 1989.

BACKGROUND OF THE INVENTION

This invention relates to a bonded ceramic metal composite substrate having a copper sheet directly bonded to a ceramic substrate, a circuit board constructed of such a bonded composite, and to a method for their production. In recent years attempts have been made to develop ceramic-metal composite substrates for use in electronic devices. For example, a capacitor element bonded to a ceramic aluminum nitride substrate is disclosed in Scace et al., U.S. Pat. No. 3,716, 759. Direct bonding of metal sheets to ceramic substrates is also described in Hill, British Pat. No. GB 2,099,742 and Jochym, U.S. Pat. No. 4,409,278, whereby channels are provided in the metal sheet or ceramic substrate in order to avoid blistering by permittng gas to escape during the bonding. Some of these attempts have involved disposing a metal sheet such as copper on a ceramic substrate and directly bonding the copper sheet to the substrate by heating to a temperature below the melting point of copper (1083° C.) and above the eutectic point of copper and oxygen (1065° C.).

This kind of composite has several advantages. It provides a strong adhesion between the metal sheet and the ceramic substrate. It also provides a simpler structure which can be easily utilized to obtain a smaller circuit board. And it provides a potentially simpler method for producing a circuit board.

However in attempting to use ceramic copper substrates prepared in the foregoing manner is circuit boards for transistor modules, the present inventors found that some of them failed to work correctly during their operation. Thus, there is a need for bonded ceramic metal substrates which will produced more reliable electronic devices.

SUMMARY OF THE INVENTION

This invention was made to solve the foregoing problem. It is the object of the invention to provide a bonded ceramic metal composite substrate having a copper sheet directly bonded to a ceramic substrate, and to provide a circuit board produced from such a composite substrate which works with a high degree of operational reliability. It is also an object of the invention to provide methods for producing such substrates and circuit boards.

This invention is directed to a bonded ceramic-metal composite substrate comprising a ceramic substrate having opposite surfaces and a copper sheet having a face directly bonded to one of the surfaces of the ceramic substrate, wherein the median surface roughness ($R_a$) of the outer surface of the copper sheet is not greater than 3 μm, and wherein the maximum surface roughness ($R_{max}$) is not greater than 18 μm.

According to a further aspect of the invention, a circuit board is provided comprising a bonded ceramic-metal composite substrate comprising a ceramic substrate having opposite surfaces and a copper sheet having opposite faces, one face of which is directly bonded to one of the surfaces of the ceramic substrate and the other face of which comprises at least one mounting area and at least one electrode area, wherein the median surface roughness ($R_a$) of the outer surface of said at least one mounting area of the copper sheet is not greater than 3 μm and the maximum surface roughness ($R_{max}$) is not greater than 18 μm; at least one electrical element mounted on said at least one mounting area of the copper sheet, and at least one bonding wire electrically connecting said at least one electrical element with said at least one electrode area.

In accordance with a further aspect of the invention, a method of producing a bonded ceramic-copper composite substrate is provided comprising the steps of applying a copper member to a desired position on the surface of a ceramic substrate and heating the resulting assembly to a temperature below the melting point of copper but above the eutectic temperature of copper and oxygen to directly bond the copper member to the substrate, wherein said copper member is selected to have an initial surface roughness such that the median surface roughness ($R_a$) of the copper member after said heating step is not greater than 3 μm, and the maximum surface roughness ($R_{max}$) of the copper member is not greater than 18 μm.

In accordance with another aspect of the invention, a method of producing a bonded ceramic copper composite substrate is provided comprising the steps of applying a copper member to a desired position on the surface of a ceramic substrate; heating the resulting assembly to a temperature below the melting point of copper but above the eutectic temperature of copper and oxygen to directly bond the copper member to the substrate, and polishing the surface of said copper member, wherein after said polishing step, the median surface roughness ($R_a$) of said copper member is not greater than 3 μm, and the maximum surface roughness ($R_{max}$) of said copper member is not greater than 18 μm.

In accordance with yet another aspect of the invention, a method of producing a circuit board is provided comprising the steps of (a) producing a bonded ceramic-metal composite substrate by applying a copper member to a desired position on the surface of a ceramic substrate and heating the resulting assembly to a temperature below the melting point of copper but above the eutectic temperature of copper and oxygen to directly bond the copper member to the substrate, said copper member having a free face comprising at least one mounting area and at least one electrode area, wherein said copper member is selected to have an initial surface roughness such that the surface roughness of the copper member after said heating step is, in terms of median roughness ($R_a$), not more than 3 μm, and, in terms of maximum surface roughness ($R_{max}$), not more than 18 μm; (b) mounting at least one electrical element on said at least one mounting area of the copper sheet, and (c) electrically connecting a bonding wire to said at least one electrical element and said at least one electrode area.

In accordance with another aspect of the invention, a method of producing a circuit board is provided comprising the steps of (a) producing a bonded ceramic-metal composite substrate by applying a copper member to a desired position on the surface of a ceramic substrate; heating the resulting assembly to a temperature below the melting point of copper but above the eutectic temperature of copper and oxygen to directly bond the copper member to the substrate, and polishing the surface of said copper member, said copper member having a free face comprising at least one mounting area and at least one electrode area, wherein after said polishing step, the median surface roughness ($R_a$) of said at least one mounting area is not greater than 3 μm, and the maximum surface roughness ($R_{max}$) of said at least one mounting area is not greater than 18 μm; (b) mounting at least one electrical element on said at least one mounting area, and (c) electrically connecting a bonding wire to said at least one electrical element and said at least one electrode area.

It is particularly preferred that the median surface rounghness ($R_a$) of the copper circuit sheet be not greater than 1 μm, and that the maximum surface roughness ($R_{max}$) be not greater than 8 μm.

Median surface roughness ($R_a$) and maximum surface roughness ($R_{max}$) are defined in Japanese Industrial Standard JIS B 0601. Median surface roughness ($R_a$) is determined by plotting a curve of measured roughness values, plotting an average line along a segment of the roughness curve where the sum of the squares deviation between the roughness curve and the average line is at a minimum, plotting a median line along the roughness curve parallel to the average line such that the median line divides the area between the roughness curve and the average line in halves, and extracting from the roughness curve a segment of length "1" along the median line. Median surface roughness ($R_a$) is then calculated according to the formula:

$$R_a = \frac{1}{l} \int_0^l |f(x)|\,dx$$

wherein the median line defines the X axis of a coordinate system, the Y axis is defined by a perpendicular to the median line, and f(x) is the roughness curve. Maximum surface roughness ($R_{max}$) is determined by plotting a curve of measured roughness values, plotting an average line along a segment of the roughness curve where the sum of the squares deviation between the roughness curve and the average line is at a minimum, and enclosing the roughness curve between two lines parallel to the average line. The maximum surface roughness is then obtained by measuring the vertical distance between the two parallel lines.

BRIEF DESCRIPTION OF THE DRAWINGS

The invention will be described in further detail with reference to the accompanying drawings in which.

DETAILED DESCRITPION OF PREFERRED EMBODIMENTS

Figure 1:
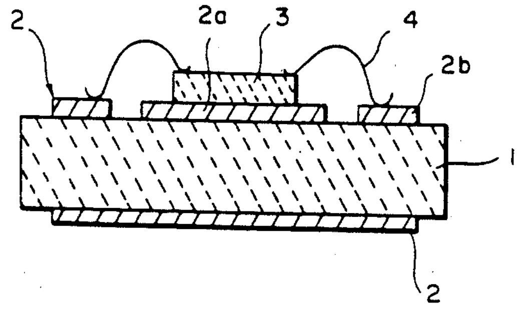
FIG. 1 is a sectional view of a circuit board construction according to the present invention showing how a semiconductor element is mounted on the copper sheet.

There are several steps to obtain a circuit board. As seen in FIG. 1, an electronic part 3 is mounted by soldering to a mounting area *2a* of a copper sheet 2 which is bonded to a ceramic sheet 1. This electronic part 3 is electrically connected through an aluminum wire 4 etc. to a separate terminal electrode are *2b* of the copper sheet. Finally, such a circuit board is usually covered with resin.

Many factors were considered as the cause why circuit boards with ceramic-metal substrates develop defects during operation or do not work at all. The present inventors discovered what the cause was. This is, the failure of the electronic components due to overheating caused the trouble. The present inventors discovered that gaps were produced between the copper circuit sheet and the electronic components, causing a lowering of heat transmissivity. This led to the serious problem of failure of the electronic components due to overheating. As a result of more experiments, the present inventors discovered that wetability with respect to solder of the copper circuit sheet caused the gaps between the copper circuit sheet and the electronic components. The present inventors also discovered that the etching treatment after heat-bonding the pattern of the copper circuit sheet is particularly subject to a lowering of solder wetability.

A ceramic circuit substrate according to this invention can be manufactured for example as follows.

Specifically, first of all, a circuit pattern is formed by arranging a copper sheet worked to the shape of the required circuit or a copper sheet in the form of a flat sheet in contact with the ceramic substrate, bonding by heating to a temperature below the melting point of copper (1083° C.) but above the eutectic temperature of copper and oxygen (1065° C.), and carrying out etching of the copper sheet as required.

If a copper sheet containing oxygen is used as the copper circuit sheet, the atmosphere during heat bonding is preferably an inert gas atmoshpere. If a copper sheet not containing oxygen is used, an atmoshpere containing 80 ppm to 3900 ppm of oxygen is preferable.

In order to assure that the surface roughness of the copper circuit sheet will be within the aforementioned range, for example, copper members whose surface roughness is within the aforesaid range are used. Also, grain growth of the copper occurs due to the heat treatment when the copper circuit sheet is bonded the ceramic substrate. As shown for example by the graph of FIG. 2, the increase in surface roughness of the copper circuit sheet is substantially proportional to the increase in the grain size of the copper. Therefore, copper members of appropriate grain size are used, and the heat treatment conditions and cooling conditions are carefully controlled. By this means, the grain size can be adjusted, and a copper circuit sheet having the desired degree of surface roughness is obtained.

Also, although a copper circuit sheet having the desired surface roughness can be obtained by appropriate selection of the copper member used and by control of the heat treatment conditions as described above, it is also possible to control the surface roughness of the copper circuit sheet by chemical polishing of the surfce after heat bonding, or, if the circuit pattern is formed by etching treatment, after this treatment. In particular, when the circuit pattern is formed by an etching treatment, fine particles of photoresist are very likely to be left behind at the grain boundaries of the copper. This lowers the solder wetability. It is therefore beneficial to carry out chemical polishing to remove the surface layer to a thickness of, for example, 0.1 μm to 20 μm. It is also possible to achieve the desired surface roughness by mechanical polishing of the surface, instead of chemical polishing, but is is difficult to remove particles of resist etc. present at the grain boundaries of the copper by mechanical polishing, so chemical polishing is preferable in such cases.

Such chemical polishing may be performed, for example, by immersion for about 1 to 5 minutes in a polishing liquid consisting of a mixture of sulfuric acid and hydrogen peroxide.

Also, it is desirable that the copper should be rolled so that the oxygen constituting the adhesive at least to the bonding face is contained in a proportion of 100 ppm to 3000 ppm with respect to the copper member that is used. A copper circuit sheet thickness in the range from 0.25 mm to 0.6 mm is suitable.

Various types of ceramic substrates can be used as the ceramic substrate in this invention, for example ceramic sintered bodies of the oxide type, such as alumina or beryllia, or ceramic sintered bodies of non-oxide type, such as aluminum nitride, silicon nitride, titanium nitride, and silicon carbide.

When ceramic substrates of the non-oxide type are used, they are preferably employed after prior oxidizing treatment of the bonding surface.

Further details of the invention will become apparent from a consideration of the following examples of preferred embodiments.

EXAMPLES 1 to 3

Copper circuit sheets were initially obtained by preparing copper members having an oxygen content of 300 ppm and the grain sizes and surface roughnesses shown in the following table, and working these into the prescribed circuit shape. Next, the ceramic circuit substrates were obtained by placing these various copper circuit sheets in contact with both faces of ceramic substrates of which the main constituent is alumina, (containing 96 weight % alumina, and 4 weight % sintering adjuvant components), then heat treating in a nitrogen gas atmosphere under the respective heating conditions shown in the following table, to effect bonding between the respective ceramic substrates and copper circuit sheets. The surface roughnesses of the copper circuit sheets on the various ceramic circuit substrates obtained in this way were, as shown in the following table.

Next solder was melted by placing solder sheets (10 mm×10 mm×0.1 mm) consisting of Sn:Pb=63:37 on the copper circuit sheets of the various ceramic circuit substrates, and heating to about 180° C. The solder wetability was then evaluated from the ratio of the bonding area of the solder and the original size of the solder sheet. These results are also shown in the following Table.

In the comparative examples shown in the Table, the solder wetability was evaluated in the same way as in the examples produced using a ceramic circuit substrate manufactured with a copper circuit sheet having a different surface roughness of the copper circuit sheet, but the other conditions were the same as in the examples according to the invention.

As is clear from the results listed in the following Table, in all of the embodiments in which the surface roughness of the copper circuit sheet was kept within the range of this invention, solder wetability such as to give no practical problems was obtained. In contrast thereto, in the case of the ceramic circuit substrates of the comparative examples, the solder wetability was poor. If electronic components, such as semiconductor elements, were then directly mounted, solder cavities were formed, thereby increasing the thermal resistance and risking failure of the electronic components.

Figure 2:
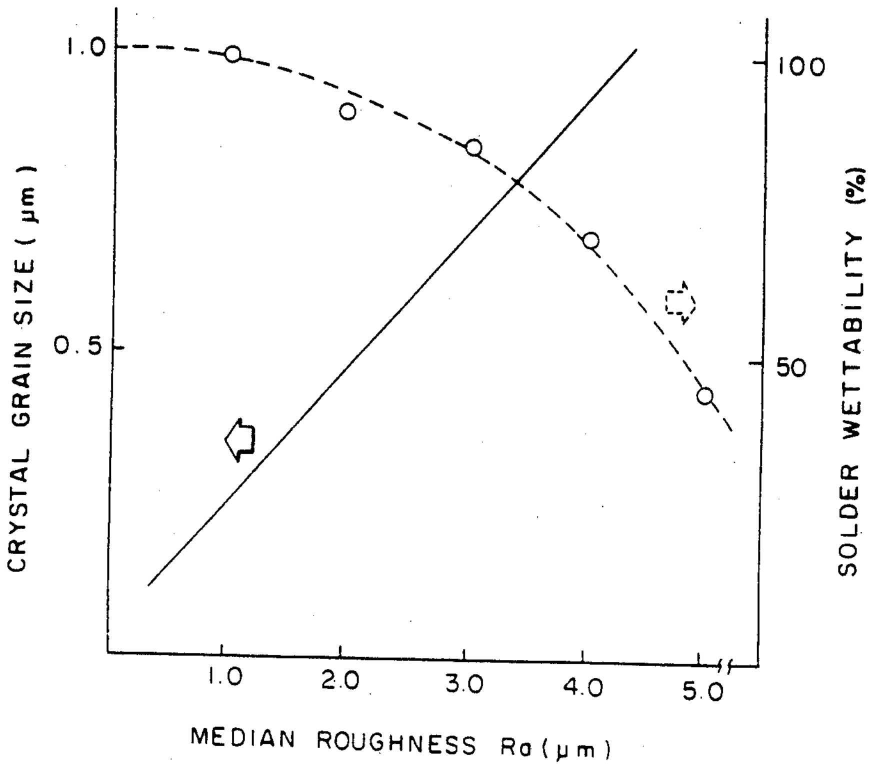
FIG. 2 is a graph showing the relationships between the median roughness ($R_a$) of the copper sheet and the grain size of the copper and solder wetability.

FIG. 2 is a graph showing the relationship between the median roughness ($R_a$) of the copper circuit sheet in the above embodiments and in the comparative examples with solder wetability. As is clear from this graph, by making the median roughness (Ra) not greatr than 3 μm, solder wetability such as to give rise to no practical problems is obtained. In particular, if the median roughness ($R_a$) is made not greater than 1 μm, much better solder wetability is obtained, and the solder wetability is stable, approaching a constant value.

TABLE

| | Properties of Copper Circuit Sheet Before Bonding | | | Bonding Conditions | | Properties of Copper Circuit Sheet after Bonding | | | |
|---|---|---|---|---|---|---|---|---|---|
| | Surface Roughness (mm) | | Crystal | | | Surface Roughness (mm) | | Crystal | Solder* |
| Sample Number | ($R_a$) | ($R_{max}$) | Grain Form | Temp. (°C.) | Time (min.) | ($R_a$) | ($R_{max}$) | Grain Size mm | Wetability (%) |
| E1 | 0.3 | 2 | Fibers | 1070 | 5 | 1.0 | 8.0 | 20-200 | 99 |
| E2 | 0.3 | 2 | Fibers | 1073 | 5 | 2.0 | 13.0 | 40-300 | 90 |
| E3 | 0.3 | 2 | Fibers | 1076 | 5 | 3.0 | 18.0 | 60-400 | 85 |
| C1 | 0.3 | 2 | Fibers | 1078 | 5 | 4.0 | 23.0 | 80-500 | 70 |
| C2 | 0.3 | 2 | Fibers | 1080 | 5 | 5.0 | 28.0 | 100-600 | 45 |

*Note:
The solder wetability is indicated by the ratio between the area after melt bonding a 10 mm by 10 mm solder sheet, and the original size.

EXAMPLE 4

A flat copper sheet having a thickness of 0.3 mm and an oxygen content of 300 ppm was placed on top of a ceramic substrate as described in Example 1. Bonding was effected by heating for 30 minutes at a temperature of 1070° C. under a nitrogen gas a atmosphere.

Next, a resist to produce the required circuit pattern was printed onto the bonded copper sheet, and the desired circuit pattern was formed by means of an etching treatment using ferric chloride solution. After this chemical polishing was performed (amount removed=-about 5 μm) of the surface by immersing for about 1 minute in a mixed aqueous solution of sulfuric acid and hydrogen peroxide ($H_2SO_4$=5 to 10%; $H_2O_2$ =3% approximately).

The median surface roughness ($R_a$) of the resulting copper circuit sheet was 1.9 μm, and the maximum surface roughness ($R_{max}$) was 8 μm.

Next, this copper circuit sheet was nickel plated to a thickness from about 0.5 μm to 2.0 μm, and the solder wetability was then measured under the same conditions as in Example 1. A value of 98% was obtained.

For comparison with this invention, a ceramic circuit substrate was manufactured under the same conditions as Example 4, except that chemical polishing with a mixed aqueous solution of sulfuric acid and hydrogen peroxide solution was omitted. When the solder wetability was determined in the same manner as in Example 4, a value of only 90% was obtained. Also, when an electron microscope was used to observe the surface of the copper circuit sheet before bonding of the solder, it was found that fine particles of resist had been left behind at the grain boundaries.

As described above, with the ceramic circuit substrate of this invention, the surface roughness of the copper circuit sheet is controlled so that excellent solder wetability is obtained. Consequently, reliability in manufacture of various electronic device, such as semiconductor modules, can be improved.

The foregoing description and examples have been set forth merely to illustrate the invention and are not intended to be limiting. Since modifications of the described embodiments incorporating the spirit and substance of the invention may occur to persons skilled in the art, the scope of the invention should be limited solely with reference to the appended claims and equivalents.

What is claimed is:

1. A method of producing a bonded ceramic metal composite substrate comprising the steps of applying a copper member to a desired position on a surface of a ceramic substrate and heating the resulting assembly to a temperature below the melting point of copper but above the eutectic temperature of copper and oxygen to directly bond the copper membe to the substrate, wherein said copper member is selected to have an initial surface roughness such that the median surface roughness ($R_a$) of said copper member after said heating step is not greater than 3 μm, and the maximum surface roughness ($R_{max}$) of said copper member after said heating step is not greater than 18 μm.

2. A method according to claim 1, wherein the median surface roughness ($R_a$) of the copper member after said heating step is not greater than 1 μm, and the maximum surface roughness ($R_{max}$) of the copper member after said heating step is not greater than 8 μm.

3. A method according to claim 1, wherein said copper member is pre-formed to the shape of a desired circuit pattern prior to application to said ceramic substrate.

4. A method according to claim 1, wherein said member is applied to said substrate in the form of a continuous sheet, said method further comprising the step of subjecting the copper member to an etching operation to form it to a desired circuit pattern after bonding to said substrate.

5. A method according to claim 4, further comprising the step of subjecting the etched copper member to a polishing operation.

6. A method according to claim 5, wherein said polishing operation is a chemical polishing operation.

7. A method of producing a circuit board comprising the steps of:

(a) producing a bonded ceramic metal composite substrate by applying a copper member to a desired position on the surface of a ceramic substrate and heating the resulting assembly to a temperature below the melting point of copper but above the eutectic temperature of copper and oxygen to directly bond the copper member to the substrate, said copper member having a free face comprising at least one mounting area and at least one electrode area, wherein said copper member is selected to have an initial surface roughness such that the median surface roughness ($R_a$) of said copper member after said heating step is not greater than 3 μm, and the maximum surface roughness ($R_{max}$) is not greater than 18 μm;

(b) mounting at least one electrical element on said at least one mounting area of the copper sheet, and (c) electrically connecting a bonding wire to said at least one electrical element and said at least one electrode area.

8. A method according to claim 7, wherein the median surface roughness ($R_a$) of the copper member is not greater than 1 μm, and the maximum surface roughness ($R_{max}$) is not greater than 8 μm.

9. A method according to claim 7, wherein said copper member is pre-formed to the shape of a desired circuit pattern prior to application to said ceramic substrate.

10. A method according to claim 7, wherein said member is applied to said substrate in the form of a continuous sheet, futher comprising the step of subjecting the copper member to an etching operation to form it to a desired circuit pattern after bonding to said substrate.

11. A method according to claim 10, further comprising the step of subjecting the etched copper member to a polishing operation.

12. A method according to claim 11, wherein said polishing operation is a chemical polishing operation.

* * * * *